United States Patent
Willaert et al.

(10) Patent No.: US 7,247,342 B2
(45) Date of Patent: Jul. 24, 2007

(54) STABLE ELECTROLUMINESCENT DEVICES

(75) Inventors: Peter Willaert, Destelbergen (BE); Tom Cloots, Londerzeel (BE); Roger Van den Bogaert, Schoten (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 10/614,148

(22) Filed: Jul. 7, 2003

(65) Prior Publication Data

US 2004/0096695 A1 May 20, 2004

Related U.S. Application Data

(62) Division of application No. 10/103,061, filed on Mar. 21, 2002, now Pat. No. 6,916,553.

(60) Provisional application No. 60/294,325, filed on May 30, 2001, provisional application No. 60/349,572, filed on Jan. 18, 2002.

(30) Foreign Application Priority Data

Mar. 29, 2001 (EP) .................................. 01000098
Dec. 10, 2001 (EP) .................................. 01000730

(51) Int. Cl.
*B05D 5/06* (2006.01)
*C09K 11/06* (2006.01)
*H01L 51/54* (2006.01)

(52) U.S. Cl. ..................... 427/66; 428/690; 428/917; 313/503; 313/509

(58) Field of Classification Search .............. 428/690, 428/917; 252/500; 313/504, 506, 503, 509; 427/66
See application file for complete search history.

(56) References Cited

U.S. PATENT DOCUMENTS

| | | | |
|---|---|---|---|
| 5,652,067 A * | 7/1997 | Ito et al. ................... 428/690 |
| 5,767,624 A * | 6/1998 | Gordon et al. ............. 313/509 |
| 5,994,496 A * | 11/1999 | Van Haare et al. ......... 528/376 |
| 6,358,437 B1 * | 3/2002 | Jonas et al. ................ 252/500 |
| 6,376,105 B1 * | 4/2002 | Jonas et al. ................ 428/690 |
| 2002/0151094 A1 * | 10/2002 | Andriessen .................. 438/29 |
| 2003/0062510 A1 * | 4/2003 | Van den Bogaert ......... 252/500 |

FOREIGN PATENT DOCUMENTS

| | | |
|---|---|---|
| DE | 196 27 071 A1 | 1/1998 |
| EP | 0 686 662 A2 | 12/1995 |
| EP | 1 003 179 A1 | 5/2000 |

OTHER PUBLICATIONS

Carter et al.; "Polymeric Anodes for Improved Polymer Light-Emitting Diode Performance," *Applied Physics Letters, American Institute of Physics*, vol. 70 (16), 2067-2069 (Apr. 21, 1997).

* cited by examiner

*Primary Examiner*—Rena Dye
*Assistant Examiner*—Camie S. Thompson
(74) *Attorney, Agent, or Firm*—Leydig Voit & Mayer, Ltd

(57) ABSTRACT

An electroluminescent device comprising a transparent or translucent support, a transparent or translucent first electrode, a second conductive electrode and an electroluminescent phosphor layer sandwiched between the transparent or translucent first electrode and the second conductive electrode, wherein the first and second electrodes each comprises a polymer or copolymer of a 3,4-dialkoxythiophene, which may be the same or different, in which the two alkoxy groups may be the same or different or together represent an optionally substituted oxy-alkylene-oxy bridge; a display comprising the above-mentioned electroluminescent device; a lamp comprising the above-mentioned electroluminescent device; manufacturing processes for the above-mentioned electroluminescent devices; and the use of such devices for the integrated backlighting of static and dynamic posters and signage.

26 Claims, No Drawings

STABLE ELECTROLUMINESCENT DEVICES

The application claims the benefit of U.S. Provisional Application No. 60/294,325 filed May 30, 2001 and the benefit of U.S. Provisional Application No. 60/349,572 filed Jan. 18, 2002.

FIELD OF THE INVENTION

The present invention relates to stable electroluminescent devices.

BACKGROUND OF THE INVENTION

EP-A 440 957 discloses dispersions of polythiophenes, constructed from structural units of formula (I):

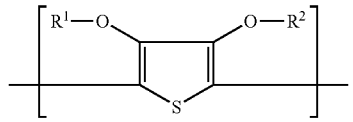

in which $R^1$ and $R^2$ independently of one another represent hydrogen or a C1-C4 alkyl group or together form an optionally substituted C1-C4-alkylene residue, in the presence of polyanions.

EP-A-686 662 discloses mixtures of A) neutral polythiophenes with the repeating structural unit of formula (I),

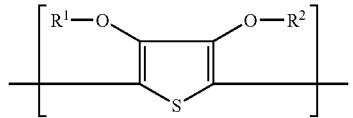

in which $R^1$ and $R^2$ independently of one another represent hydrogen or a C1-C4 alkyl group or together represent an optionally substituted C1-C4 alkylene residue, preferably an optionally with alkyl group substituted methylene, an optionally with C1-C12-alkyl or phenyl group substituted 1,2-ethylene residue or a 1,2-cyclohexene residue, and B) a di- or polyhydroxy- and/or carboxy groups or amide or lactam group containing organic compound; and conductive coatings therefrom which are tempered to increase their resistance preferably to <300 ohm/square. Furthermore, the potential use of such layers as electrodes in electroluminescence devices is disclosed.

ORGACON™ EL film is a commercially available subbed polyethylene terephthalate support coated on one side with a transparent layer of electrically conducting poly(3,4-ethylenedioxythiophene)/poly(styrene sulfonic acid) [PEDOT/PSS] produced by Agfa-Gevaert N.V. It is promoted in the current brochure for this product as a low cost alternative to polyethylene terephthalate film coated with a transparent coating of indium tin oxide (ITO) for use in electroluminescent lamps. T. Cloots et al. in the extended abstracts of the 5th International Conference on the Science and Technology of Display Phosphors held at San Diego on Nov. 8-10, 1999 disclosed a comparison of electroluminescent lamps in which ITO-PET supports have been replaced with ORGACON™ EL film. However, under simulated ageing conditions of 60° C. and 90% relative humidity electroluminescent devices produced with ORGACON™ EL film (see COMPARATIVE EXAMPLES 3 and 4) exhibited markedly inferior lifetime compared with electroluminescent devices produced with ITO-PET (see COMPARATIVE EXAMPLES 1 and 2).

ASPECTS OF THE INVENTION

It is therefore an aspect of the present invention to provide an electroluminescent device which is more economical to produce and exhibits comparable half-life and emission performances to prior art electroluminescent devices.

It is a further aspect of the present invention to provide electroluminescent devices with electrodes producible from dispersions, solutions or pastes by standard coating techniques e.g. screen coating.

Further aspects and advantages of the invention will become apparent from the description hereinafter.

SUMMARY OF THE INVENTION

Standard electroluminescent devices consist of a transparent support, two electrodes one of which is transparent and is conventionally an indium tin oxide (ITO) layer and the other is conventionally a carbon or silver layer, a dielectric layer is optionally provided adjacent to the non-transparent electrode layer and an electroluminescent phosphor layer is sandwiched between the transparent electrode and the dielectric layer if present or directly between the transparent and non-transparent electrodes if no dielectric layer is present. Surprisingly it has been found that despite the fact that replacement of either electrode with a layer comprising a polymer or copolymer of a 3,4-ethylenedioxythiophene resulted in a marked deterioration in the emission half-life of the device, replacement of both electrodes with a layer comprising a polymer or copolymer of a (3,4-ethylenedioxythiophene), e.g. poly(3,4-ethylenedioxythiophene) (PEDOT), led to a performance comparable with a device with ITO- and carbon-electrodes.

The present invention provides an electroluminescent device comprising a transparent or translucent support, a transparent or translucent first electrode, a second conductive electrode and an electroluminescent phosphor layer sandwiched between the transparent or translucent first electrode and the second conductive electrode, wherein the first and second electrodes each comprises a polymer or copolymer of a 3,4-dialkoxythiophene, which may be the same or different, in which the two alkoxy groups may be the same or different or together represent an optionally substituted oxy-alkylene-oxy bridge.

The present invention also provides a process for producing the above-mentioned electroluminescent device comprising the steps of: (i) coating a transparent or translucent support with a solution, a dispersion or a paste of a polymer or copolymer of a 3,4-dialkoxythiophene to produce the transparent or translucent first conductive layer; (ii) coating the first conductive layer with a layer comprising an electroluminescent phosphor; (iii) optionally coating the layer comprising an electroluminescent phosphor with a dielectric layer; and (iv) coating the dielectric layer, if present, or said layer comprising the electroluminescent phosphor, if no dielectric layer is present, with a solution, dispersion or paste comprising a polymer or copolymer of a (3,4-dialkoxythiophene) to produce the second conductive layer, wherein the polymer or copolymer of the (3,4-dialkoxythiophene) in the solution, dispersion or paste used in step (i) may be the same or different from the polymer or copolymer of the (3,4-dialkoxythiophene) used in the solution, dispersion or paste used in step (iv).

The present invention also provides a process for producing the above-mentioned electroluminescent device comprising the steps of: (i) coating a support with a solution, dispersion or paste comprising a polymer or copolymer of a (3,4-dialkoxythiophene) to produce the second conductive layer; (ii) optionally coating the second conductive layer with a dielectric layer; (iii) coating the dielectric layer if present, or the second conductive layer, if no dielectric layer is present, with a layer comprising an electroluminescent phosphor; and (iv) coating the layer comprising the electroluminescent phosphor with a transparent solution, dispersion or paste comprising a polymer or copolymer of a (3,4-dialkoxythiophene) to produce the transparent or translucent first conductive layer, wherein the polymer or copolymer of a (3,4-dialkoxythiophene) in the solution, dispersion or paste used in step (i) may be the same or different from the polymer or copolymer of a (3,4-dialkoxythiophene) in the transparent solution, dispersion or paste used in step (iv).

The present invention also provides for the use of a transparent paste comprising a polymer or copolymer of a (3,4-dialkoxythiophene), a polyacrylate thickener and a glycol derivative, and optionally a surfactant for producing an electrode of the above-mentioned electroluminescent lamp.

The present invention also provides for the use of the above-described electroluminescent device in illuminated posters and signage.

Preferred embodiments are disclosed in the dependent claims.

DETAILED DESCRIPTION OF THE INVENTION

Definitions

The term alkoxy means all variants possible for each number of carbon atoms in the alkoxy group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl etc.

The term oxyalkylenealkoxy means two oxygen atoms linked by an alkylene group. An alkylene group is a substituted or unsubstituted hydrocarbon group e.g. a —$(CH_2)_n$— group where n is an integer between 1 and 4, which may be substituted with an alkoxy, aryloxy, alkyl, aryl, alkaryl, alkyloxyalkyl, alkyloxyalkaryl, alkyloxyaryl, hydroxy, carboxy, carboxyalkyl, carboxyamino, sulfo or alkylsulfo group.

The term derivatives as used in connection with a particular polymer refers to variants thereof substituted with alkyl, alkoxy, alkyloxyalkyl, carboxy, alkylsulfonato and carboxy ester groups.

The term transparent as used in disclosing the present invention means having the property of transmitting at least 70% of the incident light without diffusing it.

The term translucent as used in disclosing the present invention means allowing the passage of light, yet diffusing it so as not to render bodies lying beyond clearly visible.

The term aqueous as used in disclosing the present invention means water and mixtures of water with water-miscible organic solvents such as alcohols e.g. methanol, ethanol, 2-propanol, butanol, iso-amyl alcohol, octanol, cetyl alcohol etc.; glycols e.g. ethylene glycol; glycerine; N-methyl pyrrolidone; methoxypropanol; and ketones e.g. 2-propanone and 2-butanone etc. in which at least 50% by volume of water is present.

Coating is a process in which a continuous or a discontinuous layer is formed and includes printing techniques such as screen printing, offset printing and flexographic printing.

The term flexible as used in disclosing the present invention means capable of following the curvature of a curved object such as a drum e.g. without being damaged.

The term busbar refers to a highly conducting generally metal particle-containing electrode applied to at least part of the surface of the first transparent or translucent electrode and to at least part of the surface of the second conductive electrode.

The term Newtonian behaviour refers to a viscosity with no more than 10% variation in the shear rate range 1 to 80 $s^{-1}$ measured with increasing shear rate for concentrations in the medium concerned up to 2% by weight in the absence of other ingredients.

The term non-Newtonian behaviour refers to a viscosity with more than 10% variation in the shear rate range 1 to 80 $s^{-1}$ measured with increasing shear rate for concentrations in the medium concerned below 2% by weight and in the absence of other ingredients.

PEDOT as used in the present disclosure stands for poly(3,4-ethylenedioxythiophene).

PSS as used in the present disclosure stands for poly (styrene sulfonic acid) or poly(styrene sulfonate).

The terms illuminated posters and signage as used in disclosing the present invention may also incorporate animation i.e. making one or more areas turn ON or OFF at designated intervals of time.

Electroluminescent Device

An electroluminescent device according to the present invention comprises a transparent or translucent support, a transparent or translucent first electrode, a second conductive electrode and an electroluminescent phosphor layer sandwiched between the transparent or translucent first electrode and the second conductive electrode, wherein the first and second electrodes each comprises a polymer or copolymer of a (3,4-dialkoxythiophene), which may be the same or different, in which the two alkoxy groups may be the same or different or together represent an optionally substituted oxy-alkylene-oxy bridge.

According to a first embodiment of the electroluminescent devices according to the present invention a dielectric layer is included between the phosphor layer and the second conductive electrode.

According to a second embodiment of the electroluminescent device of the present invention dielectric layers are provided between the electroluminescent phosphor layer and the transparent or translucent first electrode and between the electroluminescent layer and the second conductive electrode.

The electroluminescent phosphor layer is generally 5 to 40 μm thick.

The transparent or translucent first electrode can be provided by coating a paste, a dispersion or a solution.

The conductive second electrode can also be provided by coating a paste, a dispersion or a solution.

Preparation Process for an Electroluminescent Device

The present invention provides a process for producing the electroluminescent device according to the present invention comprising the steps of: (i) coating a transparent or translucent support with a solution, a dispersion or a paste of a polymer or copolymer of a 3,4-dialkoxythiophene to produce the transparent or translucent first conductive layer; (ii) coating the first conductive layer with a layer comprising an electroluminescent phosphor; (iii) optionally coating the layer comprising an electroluminescent phosphor with a dielectric layer; and (iv) coating the dielectric layer, if present, or said layer comprising the electroluminescent phosphor, if no dielectric layer is present, with a solution, dispersion or paste comprising a polymer or copolymer of a 3,4-dialkoxythiophene to produce the second conductive layer, wherein the polymer or copolymer of the (3,4-dialkoxythiophene) in the solution, dispersion or paste used in step (i) may be the same or different from the polymer or copolymer of the 3,4-dialkoxythiophene) used in the solution, dispersion or paste used in step (iv).

The present invention provides a second process for producing the electroluminescent device according to the present invention comprising the steps of: (i) coating a support with a solution, dispersion or paste comprising a polymer or copolymer of a (3,4-dialkoxythiophene) to produce the second conductive layer; (ii) optionally coating the second conductive layer with a dielectric layer; (iii) coating the dielectric layer, if present, or the second conductive layer, if no dielectric layer is present, with a layer comprising an electroluminescent phosphor; and (iv) coating the electroluminescent phosphor layer with a transparent solution, dispersion or paste comprising a polymer or copolymer of a (3,4-dialkoxythiophene) to produce the transparent or translucent first conductive layer, wherein the polymer or copolymer of a (3,4-dialkoxythiophene) in the solution, dispersion or paste used in step (i) may be the same or different from the polymer or copolymer of a (3,4-dialkoxythiophene) in the transparent solution, dispersion or paste used in step (iv).

The first and second electrodes each comprise a polymer or copolymer of a (3,4-dialkoxythiophene), which may be the same or different, and may be printed or coated from a solution, a dispersion or a paste.

According to a first embodiment of a process for producing a device according to the present invention, the first transparent or translucent electrode is coated or printed from an aqueous paste.

According to a second embodiment of a process for producing a device according to the present invention, the second electrode is coated or printed from an aqueous paste.

Polymer or Copolymer of a (3,4-dialkoxythiophene)

The first and second electrodes of the electroluminescent device according to the present invention contain a polymer or copolymer of a 3,4-dialkoxythiophene having the formula

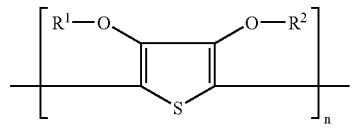

in which, each of $R^1$ and $R^2$ independently represents hydrogen or a C1-4 alkyl group or together represent an optionally substituted C1-4 alkylene group or a cycloalkylene group.

According to a third embodiment of the electroluminescent device of the present invention, the first and second electrodes of the electroluminescent device preferably contain a polymer or copolymer of a 3,4-dialkoxythiophene in which the two alkoxy groups together represent an optionally substituted oxy-alkylene-oxy bridge.

According to a fourth embodiment of the electroluminescent device of the present invention, the polymers or copolymers of a 3,4-dialkoxy-thiophenes in which the two alkoxy groups together represent an optionally substituted oxy-alkylene-oxy bridge are selected from the group consisting of: poly(3,4-methylenedioxythiophene), poly(3,4-methylenedioxythiophene) derivatives, poly(3,4-ethylenedioxythiophene), poly(3,4-ethylene-dioxythiophene) derivatives, poly(3,4-propylenedioxythiophene), poly(3,4-propylenedioxy-thiophene) derivatives, poly(3,4-butylenedioxythiophene) and poly(3,4-butylenedioxythiophene) derivatives and copolymers thereof.

According to a fifth embodiment of the electroluminescent device of the present invention, the substituents for the oxy-alkylene-oxy bridge are alkyl, alkoxy, alkyloxyalkyl, carboxy, alkylsulfonato and carboxy ester groups.

According to a sixth embodiment of the electroluminescent device of the present invention, in the poly(3,4-dialkoxythiophenes) the two alkoxy groups together represent an optionally substituted oxy-alkylene-oxy bridge which is a 1,2-ethylene group, an optionally alkyl-substituted methylene group, an optionally C1-C12 alkyl- or phenyl-substituted 1,2-ethylene group, a 1,3-propylene group or a 1,2-cyclohexylene group.

Such polymers are disclosed in Handbook of Oligo- and Polythiophenes Edited by D. Fichou, Wiley-VCH, Weinheim (1999); by L. Groenendaal et al. in Advanced Materials, volume 12, pages 481-494 (2000); L. J. Kloeppner et al. in Polymer Preprints, volume 40(2), page 792 (1999); P. Schottland et al. in Synthetic Metals, volume 101, pages 7-8 (1999); and D. M. Welsh et al. in Polymer Preprints, volume 38(2), page 320 (1997).

Polyanion Compound

The polyanion compounds for use in the first and second conductive electrodes of the electroluminescent device of the present invention are disclosed in EP-A 440 957 and include polymeric carboxylic acids, e.g. polyacrylic acids, polymethacrylic acids, or polymaleic acids and polysulphonic acids, e.g. poly(styrene sulphonic acid). These polycarboxylic acids and polysulphonic acids can also be copolymers of vinylcarboxylic acids and vinylsulphonic acids with other polymerizable monomers, e.g. acrylic acid esters, methacrylic acid esters and styrene. A particularly preferred polyanion compound for use in the first and second conductive electrodes of the electroluminescent device according to the present invention is poly(styrene sulphonic acid) and copolymers thereof with styrene.

Paste Comprising a Polymer or Copolymer of a (3,4-dialkoxythiophene)

Suitable aqueous pastes comprising a polymer or copolymer of a (3,4-dialkoxythiophene) are disclosed in WO 99/34371 in which a screen paste with a viscosity of 1 to 200 dPas is disclosed containing a solution or dispersion of a conductive polymer and optionally binders, thickeners and fillers. However, WO 99/34371 only specifically discloses an acrylate binder with Newtonian behaviour.

It has been found that binders with non-Newtonian behaviour are suitable thickeners for use in aqueous pastes or inks e.g. high molecular weight homo- and copolymers of acrylic acid crosslinked with a polyalkenyl polyether, such as the CARBOPOL® resins of B. F. Goodrich e.g. CARBOPOL® ETD 2623, and xanthan gum, e.g. BIOSAN® S from Hercules Inc., USA and Kelzan® T from MERCK & Co., Kelco Division, USA. These binders are particular types of the polyacrylate and polysaccharide classes of binder. Polysaccharide thickeners include cellulose, cellulose derivatives e.g. carboxymethyl cellulose, guar gum and xanthan gum.

Typically such pastes or inks have a pH of 2.0, because A. N. Aleshin et al. showed in 1998 in Synthetic Metals, volume 94, pages 173-177, that pH's above 3 lead to a dramatic decrease in electrical conductivity. Furthermore, it has been found that the electrical conductivity of conductive layers produced with dispersions comprising a polymer or copolymer of a (3,4-dialkoxythiophene) typically exhibit a dramatic decrease in conductivity for dispersions with pH's above 3.

However, it has been found that pastes or inks having a pH of up to 7 produced with a polymer or copolymer of a (3,4-dialkoxythiophene) and non-Newtonian binders of the type CARBOPOL, which require a pH of $\geq 4$ in order to obtain their maximum thickening effect in an aqueous medium; a glycol derivative; and optionally a surfactant can be used to produce a transparent electrode for an electroluminescent lamp with a surface resistances $\leq 1000$ $\Omega$/square at visual transmissions>75%. Such surface resistances are comparable with those typically observed for pastes having pH's $\leq 3$.

Suitable pastes can also incorporate binders with Newtonian behaviour, pigments and dyes, crosslinking agents, anti-foaming agents and surfactants.

Non-transparent pastes can, for example, be realized by incorporating a pigment such as LEVACRYL® A-SF, a black pigment from BAYER, into the above-mentioned paste, used for producing transparent electrodes, in a weight sufficient to give non-transparency in the layer thickness being coated. Other suitable black pigments are KL1925, a carbon black dispersion from DEGUSSA, and MHI Black 8102M, a carbon black dispersion from MIKUNI, and titanium dioxide pigments.

Transparent coloured compositions can be realized by incorporating coloured dyes or pigments e.g. Rhodamine 6G, copper phthalocyanine and phthalocyanine pigments such as Flexonyl® Blau BZG, a blue-green pigment from BAYER.

Suitable cross-linking agents are epoxysilanes (e.g. 3-glycidoxypropyltrimethoxysilane), hydrolysis products of silanes (e.g. hydrolysis products of tetraethyoxysilane or tetramethoxysilane) as disclosed in EP 564 911, herein incorporated by reference, and di- or oligo-isocyanates optionally in blocked form.

A suitable anti-foaming agent is the silicone antifoam agent X50860A.

Preferred surfactants are anionic and non-ionic surfactants with non-ionic surfactants being particularly preferred. Preferred non-ionic surfactants are selected from the group of surfactants consisting of ethoxylated/fluroralkyl surfactants, polyethoxylated silicone surfactants, polysiloxane/polyether surfactants, ammonium salts of perfluro-alkylcarboxylic acids, polyethoxylated surfactants and fluorine-containing surfactants. Suitable non-ionic surfactants are:

Surfactant no. 01=ZONYL® FSN, a 40% by weight solution of $F(CF_2CF_2)_{1-9}CH_2CH_2O(CH_2CH_2O)_xH$ in a 50% by weight solution of isopropanol in water where x=0 to about 25, from DuPont;

Surfactant no. 02=ZONYL® FSN 100: $F(CF_2CF_2)_{1-9}CH_2CH_2O(CH_2CH_2O)_xH$ where x=0 to about 25, from DuPont;

Surfactant no. 03=ZONYL® FS300, a 40% by weight aqueous solution of a fluorinated surfactant, from DuPont;

Surfactant no. 04=ZONYL® FSO, a 50% by weight solution of $F(CF_2CF_2)_{1-7}CH_2CH_2O(CH_2CH_2O)_yH$ where y=0 to ca. 15 in a 50% by wt. solution of ethylene glycol in water, from DuPont;

Surfactant no. 05=ZONYL® FSO 100, a mixture of ethoxylated non-ionic fluoro-surfactant with the formula: $F(CF_2CF_2)_{1-7}CH_2CH_2O(CH_2CH_2O)_yH$ where y=0 to ca. 15, from DuPont;

Surfactant no. 06=TEGOGLIDE® 410, a polysiloxane-polymer copolymer surfactant, from Goldschmidt;

Surfactant no. 07=TEGOWET®, a polysiloxane-polyester copolymer surfactant, from Goldschmidt;

Surfactant no. 08=FLUORAD® FC431: $CF_3(CF_2)_7SO_2(C_2H_5)N—CH_2CO—(OCH_2CH_2)_nOH$ from 3M;

Surfactant no. 09=FLUORAD® FC126, a mixture of the ammonium salts of perfluorocarboxylic acids, from 3M;

Surfactant no. 10=Polyoxyethylene-10-lauryl ether

A particularly preferred non-ionic surfactant is ZONYL® FSO 100.

Suitable anionic surfactants are:

Surfactant no. 11=ZONYL® 7950, a fluorinated surfactant, from DuPont;

Surfactant no. 12=ZONYL® FSA, 25% by weight solution of $F(CF_2CF_2)_{1-9}CH_2CH_2SCH_2CH_2COOLi$ in a 50% by weight solution of isopropanol in water, from DuPont;

Surfactant no. 13=ZONYL® FSE, a 14% by weight solution of $[F(CF_2CF_2)_{1-7}CH_2CH_2O]_xP(O)(ONH_4)_y$ where x=1 or 2; y=2 or 1; and x+y=3 in a 70% by wt solution of ethylene glycol in water, from DuPont;

Surfactant no. 14=ZONYL® FSJ, a 40% by weight solution of a blend of $F(CF_2CF_2)_{1-7}CH_2CH_2O]_xP(O)(ONH_4)_y$ where x=1 or 2; y=2 or 1; and x+y=3 with a hydrocarbon surfactant in 25% by weight solution of isopropanol in water, from DuPont;

Surfactant no. 15=ZONYL® FSP, a 35% by weight solution of $[F(CF_2CF_2)_{1-7}CH_2CH_2O]_xP(O)(ONH_4)_y$ where x=1 or 2; y=2 or 1 and x+y=3 in 69.2% by weight solution of isopropanol in water, from DuPont;

Surfactant no. 16=ZONYL® UR: $[F(CF_2CF_2)_{1-7}CH_2CH_2O]_x P(O)(OH)_y$ where x=1 or 2; y=2 or 1 and x+y=3, from DuPont;

Surfactant no. 17=ZONYL® TBS: a 33% by weight solution of $F(CF_2CF_2)_{3-8}CH_2CH_2SO_3H$ in a 4.5% by weight solution of acetic acid in water, from DuPont;

Surfactant no. 18=Ammonium salt of perfluoro-octanoic acid;

Layers of the pastes exhibit excellent adhesion to phosphor layers, polyacrylate subbing layers, polycarbonate and polyesters e.g. poly(ethylene terephthalate) and surface resistances≦1000 Ω/square at visual light transmissions>75%, with ≧85% being obtainable.

Compositions of suitable pastes are given in Table 1.

TABLE 1

|  | PEDOT paste 02 | PEDOT paste 03 | PEDOT paste 04 |
|---|---|---|---|
| 1.2% dispersion of PEDOT/PSS [g] | 100 | 100 | 100 |
| CARBOPOL ™ ETD 2623 [g] | 1.0 | 1.0 | 2.0 |
| diethylene glycol [g] | 15 | 15 | 15 |
| n-propanol [g] | 10 | 10 | 10 |
| LEVANYL ™ A-SF [g] | — | 3.6 | 1.92 |
| ZONYL ™ FS100 [g] | — | — | 0.16 |
| ammonia (25% in water) to pH of | 5 | 5 | 4.2 |

The compositions of prints printed with a manual press with P48 mesh and P79 screens followed by drying at 110° C. for 5 minutes are given in Table 2 for PEDOT paste 02, 03 and 04. The surface resistances of these prints were measured by contacting the printed layer with parallel copper electrodes each 35 mm long and 35 mm apart capable of forming line contacts, the electrodes being separated by a TEFLON® insulator. This enabled a direct measurement of the surface resistance per square to be realized. The surface resistances are given in Table 2 together with the optical densities of these layers measured in transmission with a MacBeth™ TR924 densitometer with a visible filter. In the case of the prints with PEDOT paste 02 the optical density measurements were carried out on 10 strips and the optical density obtained by the dividing the optical density obtained by ten after subtracting the optical density of the PET support.

TABLE 2

|  | PEDOT paste 02 | | | PEDOT paste 03 | | PEDOT paste 04 | | |
|---|---|---|---|---|---|---|---|---|
| Screen | P48 | P79 | P120 | P48 | P79 | P48 | P79 | P120 |
| PEDOT/PSS [mg/m²] | 455 | 285 | — | 443 | 277 | 443 | 277 | — |
| CARBOPOL ™ ETD 2623 [mg/m²] | 379 | 237 | — | 379 | 237 | 759 | 474 | — |
| LEVANYL ™ A-SF [mg/m²] | — | — | — | 382 | 239 | 204 | 127 | — |
| ZONYL ™ FS0100 [mg/m²] | — | — | — | — | — | 61 | 38 | — |
| surface resistance [Ω/square] | 550 | 800 | 1600 | — | 700 | 600 | 830 | 1400 |
| optical density (vis) | 0.08 | 0.06 | 0.03 | — | 0.50 | 0.80 | 0.58 | 0.44 |

Electroluminescent Phosphors

According to a seventh embodiment of the electroluminescent device of the present invention, the electroluminescent phosphor belong to the class of II-VI semiconductors e.g. ZnS, or are a combination of group II elements with oxidic anions, the most common being silicates, phosphates, carbonates, germanates, stannates, borates, vanadates, tungstates and oxysulphates. Typical dopants are metals and all the rare earths e.g. Cu, Ag, Mn, Eu, Sm, Tb and Ce.

According to an eighth embodiment of the electroluminescent device of the present invention, the electroluminescent phosphor is encapsulated with a transparent barrier layer against moisture e.g. $Al_2O_3$ and AlN. Such phosphors are available from Sylvania, Shinetsu polymer KK, Durel, Acheson and Toshiba. An example of coatings with such phosphors is 72×, available from Sylvania/GTE, and coatings disclosed in U.S. Pat. No. 4,855,189.

According to a ninth embodiment of the electroluminescent device of the present invention, the electroluminescent phosphor is ZnS doped with manganese, copper or terbium, $CaGa_2S_4$ doped with cerium, electroluminescent phosphor pastes supplied by DuPont e.g.: LUXPRINT® type 7138J, a white phosphor; LUXPRINT® type 7151J, a green-blue phosphor; and LUXPRINT® type 7174J, a yellow-green phosphor; and ELECTRODAG® EL-035A supplied by Acheson. According to a tenth embodiment of the electroluminescent device of the resent invention, the electroluminescent phosphor is a zinc sulphide phosphor doped with manganese and encapsulated with AlN.

Dielectric Layer

Any dielectric material may be used in the dielectric layer, with yttria and barium titanate being preferred e.g. the barium titanate paste LUXPRINT® type 7153E high K dielectric insulator supplied by DuPont and the barium titanate paste ELECTRODAG® EL-040 supplied by Acheson. A positive ion exchanger may be incorporated into the dielectric layer to capture any ions dissolving escaping from the phosphor of the light-emitting layer. The amount of ion exchanger in the dielectric layer has to be optimized so that it has a maximum effectiveness in reducing black spots while not reducing the initial brightness level. It is therefore preferred to add 0.5 to 50 parts by weight of ion exchanger to 100 parts by weight of the total amount of resin and dielectric material in the dielectric layer. The ion exchanger may be organic or inorganic.

Suitable inorganic ion exchangers are hydrated antimony pentoxide powder, titanium phosphate, salts of phosphoric acid and silicic acid and zeolite.

Transparent or Translucent Support

A transparent or translucent support suitable of use in the electroluminescent device of the present invention may be rigid or flexible and consist of a glass, a glass-polymer laminate, a polymer laminate, a thermoplastic polymer or a duroplastic polymer. Examples of thin flexible supports are those made of a cellulose ester, cellulose triacetate, polypropylene, polycarbonate or polyester, with polyethylene terephthalate or polyethylene naphthalene-1,4-dicarboxylate being particularly preferred.

Uses of Electroluminescent Devices

The polymer thick-film electroluminescent devices according to the present invention are particularly suitable for use in illuminated posters and signage, particularly non-flat posters or signage or posters and signage subject to bending and flexing during use. Posters and signage incorporating electroluminescent devices are commercially available with a 4-colour poster on one side of the support and an electroluminescent device on the other are commercially available. However, such posters are produced by laminating the two devices together to the detriment of registration between the poster and the electroluminescent device. Furthermore, the posters are produced by screen printing with opaque inks and pastes, which results in relatively poor resolution images and limited illumination possibilities.

The use of the electroluminescent device, according to the present invention, in association with flexible transparent supports enables four colour printing techniques to be used with superior artwork and improved registration.

By incorporating animation i.e. making one or more areas turn ON or OFF at designated intervals, the attractiveness of the sign can be greatly enhanced in comparison to non-illuminated signs. The advantages of such signs are: their thinness, their light weight, their flexibility and their low power consumption.

Industrial application

An electroluminescent device according to the present invention can be used in lamps, displays, backlights e.g. LCD, automobile dashboard and keyswitch backlighting, emergency lighting, cellular phones, personal digital assistants, home electronics, indicator lamps and other applications in which light emission is required. Electroluminescent devices according to the present invention are operated at an AC voltage of 30 to 3000V, typically 80 to 120V and a frequency of 50 to 10000 Hz, typically 400 to 1200 Hz.

The invention is illustrated hereinafter by way of COMPARATIVE EXAMPLES and INVENTION EXAMPLES. The percentages and ratios given in these examples are by weight unless otherwise indicated. The lamps of the COMPARATIVE and INVENTION EXAMPLES illustrating the present invention used the supports given in Table 3.

TABLE 3

| support nr. | polymer foil | subbing layer nr. | coating |
|---|---|---|---|
| 01* | polyethylene terephthalate | — | sputtered ITO layer |
| 02# | polyethylene terephthalate | 02 | PEDOT/PSS layer |
| 03 | polyethylene terephthalate | 01 | — |
| 04 | polyethylene terephthalate | 02 | — |
| 05 | polyethylene terephthalate | 03 | — |
| 06 | polyethylene terephthalate | 04 | — |
| 07** | polyethylene terephthalate | 05 | — |
| 08 | polycarbonate | 06 | — |

*ITO 60 from Innovative Specialty Films (ISF) with a surface resistance of 60 Ω/square
ORGACON ™ EL from Agfa-Gevaert N.V., a subbed polyethylene terephthalate support coated with a transparent layer of electrically conducting poly(3,4-ethylenedioxy-thiophene)/poly-styrene sulfonic acid [PEDOT/PSS] from an aqueous dispersion with a surface resistivity on the PEDOT/PSS-coated side of better than 2500 ohm/square
**AUTOTYPE ™ V200

Subbing layer Nr. 01 (V671/02) has the composition:

| | |
|---|---|
| Copolymer of 50 mol % ethylene glycol, 26.5 mol % terephthalic acid, 20 mol % isophthalic acid, 3.5 mol % sulfoisophthalic acid | 79.8% |
| Kieselsol 100 F, a silica from BAYER | 19.9% |
| ARKOPON ™ T, a surfactant from Clariant | 0.3% |

Subbing layer Nr. 02 (V664/14) has the composition:

| | |
|---|---|
| copolymer of 88% vinylidene chloride, 10% methyl acrylate and 2% itaconic acid | 79.1% |
| Kieselsol ® 100 F, a colloidal silica from BAYER | 18.6% |
| MERSOLAT ® H, a surfactant from BAYER | 0.4% |
| ULTRAVON ® W, a surfactant from Ciba-Geigy | 1.9% |

Subbing layer Nr. 03 (V957/02) has the composition:

copolymer of 50 mol % ethylene glycol, 26.5 mol % terephthalic acid, 20 mol % isophthalic acid, 3.45 mol % sulfoisophthalic acid and 0.05 mol % of

[chemical structure: bis(dimethyl 5-aminoisophthalate) linked by -NH-CO-(CH$_2$)$_2$-CO-NH-]  77.2%

| | |
|---|---|
| copolymer of 20% ethyl acrylate and 80% methacrylic acid | 5.8% |
| HORDAMER ® PE02, aqueous dispersion of polyethylene from Hoechst | 2.4% |
| PAREZ RESIN ® 707, a melamine-formaldehyde resin from American Cyanamid | 14.6% |

Subbing layer Nr. 04 (T787) has the composition:

| | |
|---|---|
| Copolymer of 50 mol % ethylene glycol, 26.5 mol % terephthalic acid, 20 mol % isophthalic acid, 3.5 mol % sulfoisophthalic acid | 79.8% |
| Kieselsol 100 F, a colloidal silica from BAYER | 19.9% |
| ARKOPON ® T, a surfactant from Clariant | 0.3% | coated with:

| | |
|---|---|
| LAPONITE ® RD (magnesium silicate) | 13.88% |
| gelatin | 24.91% |
| BRONIDOX ®, a bactericide | 0.35% |
| acylated ULTRAVON ® W, a surfactant from Ciba Geigy | 1.42% |
| ARKOPAL ® N60, a surfactant from Clariant | 0.72% |
| Trimethylolpropane | 13.35% |
| Kieselsol ® 500, a colloidal silica from BAYER | 41.63% |
| PERAPRET ™ PE40, a polyethylene latex from BASF | 2.67% |
| Poly(methyl methacrylate) matting agent | 1.07% |

The starting material for the preparation of the PEDOT pastes described in the INVENTION EXAMPLES was a ca. 1.2% by weight aqueous dispersion of PEDOT/PSS containing a weight ratio PEDOT to PSS of 1:2.4 prepared as disclosed in EP-A 440 957 and having a typical viscosity measured using an AR1000 plate and cone rheometer (diameter 4 cm; cone angle 2°) at 20° C. of 38 mPa.s at a shear rate of 5 $s^{-1}$ decreasing to 33.5 mPa.s at a shear rate of 35 mPa.s and has a typical pH of 1.9. This starting material was either BAYTRON P from BAYER AG or was an AGFA-GEVAERT NV product.

then printing a layer of the DuPont LUXPRINT® type 7144E, carbon conductor ink (resistance of 80 ohm/square), as the second electrode; and finally applying a layer of the DuPont LUXPRINT® type 7145L rear electrode, silver conductor (resistance of 1 ohm/square) or a layer of PEDOT/PSS using PEDOT paste 01 (resistance of 1100 ohm/square).

Bus bars were applied to the transparent electrode with DuPont LUXPRINT® type 7145L rear electrode, silver conductor ink and to the second electrode if not silver. The configurations of the electroluminescent devices of INVENTION EXAMPLES 1 and 2 and COMPARATIVE EXAMPLES 1 to 6 are given in Table 4.

TABLE 4

|  | support with first electrode | phosphor | insulator layers | second electrode | bus bar for 2nd electrode |
|---|---|---|---|---|---|
| Comparative Example nr |  |  |  |  |  |
| 1 | nr. 01 (ITO) | 7151J | 3 of 7153J | 7144E (carbon) | 7145L ((silver) |
| 2 | nr. 01 (ITO) | 7151J | 3 of 7153J | 7144E (carbon) | 7145L (silver) |
| 3 | nr. 02 (PEDOT/PSS) | 7151J | 2 of 7153J | 7144E (carbon) | 7145L (silver) |
| 4 | nr. 02 (PEDOT/PSS) | 7151J | 3 of 7153J | 7144E (carbon) | 7145L (silver) |
| 5 | nr. 01 (ITO) | 7151J | 2 of 7153J | PEDOT paste 01 | 7145L (silver) |
| 6 | nr. 01 (ITO) | 7151J | 3 of 7153J | PEDOT paste 01 | 7145L (silver) |
| Invention Example nr |  |  |  |  |  |
| 1 | nr. 02 (PEDOT/ PSS) | 7151J | 2 of 7153J | PEDOT paste 01 | 7145L (silver) |
| 2 | nr. 02 (PEDOT/PSS) | 7151J | 3 of 7153J | PEDOT paste 01 | 7145L (silver) |

INVENTION EXAMPLES 1 AND 2 AND COMPARATIVE EXAMPLES 1 TO 6

Preparation of PEDOT Paste 01

The PEDOT [poly(3,4-ethylenedioxythiophene)] paste 01 used for screen printing the back electrodes on the dielectric layer of INVENTION EXAMPLES 1 and 2 and COMPARATIVE EXAMPLES 5 and 6 was produced as follows: a commercially available aqueous dispersion of PEDOT/PSS (BAYTRON® P from BAYER AG; weight ratio PEDOT:PSS=1:2.46) with 1.3% by weight solids was concentrated to a solids content of 3.0% by weight; and 160 g of this concentrate, 33.0 g of N-methylpyrrolidone, 4.8 g of 3-glycidoxypropyltrimethoxy-silane, 15.3 g of a polyurethane dispersion and 87.0 g of dipropylene glycol dimethyl ether were stirred for 10 minutes at 8000 rpm thereby obtaining PEDOT paste 01 with a viscosity of ca. 8 Pas at 25° C. and a shear rate of 10 $s^{-1}$.

Preparation of Electroluminescent Devices

The electroluminescent devices of INVENTION EXAMPLES 1 and 2 and COMPARATIVE EXAMPLES 1 to 6 were prepared either using support 01 or support nr. 02 (see above) as follows:

screen printing the transparent electrode with a DuPont LUXPRINT® type 7151J electroluminescent phosphor paste;

then printing 2 or 3 layers of the DuPont LUXPRINT® type 7153E high K dielectric insulator ink (barium titanate);

Support nr. 02 (ORGACON® EL film) can be produced by conventional coating techniques and hence is much more economical to produce than support 02, ITO-60, produced by sputtering of indium tin oxide on polyethylene terephthalate film.

Evaluation of the Electroluminescent Devices

The performance of the electroluminescent devices of INVENTION EXAMPLES 1 and 2 and COMPARATIVE EXAMPLES 1 to 6 were evaluated in simulated endurance tests by monitoring the emission of the devices with a United Detector Technology Serial #67146 silicon photo-multiplier in contact with the non-coated side of the support when an AC voltage of 100V at 400 Hz was applied to the electroluminescent devices in a conditioning chamber having a temperature of 60° C. and a relative humidity of 90%. The initial emission in $cd/m^2$ and the emission half-lives of the devices are given in Table 5. The percentage of initial resistance after 5 days was determined with a pair of devices, in which a voltage is only applied to one device and the resistance of the device to which a voltage had been applied monitored with respect to the resistance of an identical device to which no voltage had been applied. The results expressed as a relative percentage with respect to the device to which no voltage had been applied are given in the final column of Table 5.

TABLE 5

|  | Initial emission [cd/m$^2$] | Emission half-life [hours] | % age of initial emission after 120 hours | % age of initial resistance after 120 hours |
|---|---|---|---|---|
| Comparative Example nr | | | | |
| 1 | 41 | 181 | 59 | 83 |
| 2 | 53 | 78 | 21 | 86 |
| 3 | 38 | 16 | 0 | 644 |
| 4 | 33 | 20 | 0 | 653 |
| 5 | 43 | 10 | 0 | 136 |
| 6 | 36 | 10 | 0 | 151 |
| Invention Example nr | | | | |
| 1 | 35 | 83 | 37 | 129 |
| 2 | 29 | 89 | 38 | 187 |

The electroluminescent devices of COMPARATIVE EXAMPLES 1 and 2 with a transparent electrode consisting of sputtered ITO and a non-transparent electrode of carbon have a configuration for electroluminescent devices. It was surprisingly found that replacing either the carbon electrode or the ITO-electrode in this conventional configuration with a PEDOT/PSS-containing electrode resulted in a significant deterioration in the lifetime of the electroluminescent device from >100 hours to 16 to 20 hours for replacement of the ITO-electrode with a PEDOT/PSS-containing electrode, see the results for COMPARATIVE EXAMPLES 3 and 4, and from >100 hours to 10 hours for replacement of the carbon electrode with a PEDOT/PSS-containing electrode, see the results for COMPARATIVE EXAMPLES 5 and 6.

It was therefore surprising that, despite the fact that replacement of either electrode in the conventional electroluminescent device configuration with a layer comprising a polymer or copolymer of a 3,4-ethylenedioxythiophene resulted in a marked deterioration in the emission half-life of the device, replacement of both electrodes with a layer comprising a polymer or copolymer of a (3,4-ethylenedioxythiophene), e.g. PEDOT, led to a performance comparable with a device with ITO- and carbon-electrodes.

From Table 5, it can be seen that the initial emission and half-lives of the lamps of COMPARATIVE EXAMPLES 1 and 2 in which the two electrodes were ITO and carbon were comparable to those of the electroluminescent devices INVENTION EXAMPLES 1 and 2 in which the two electrodes contained PEDOT, according to the present invention. Moreover, ORGACON® EL film can be produced by conventional coating processes and hence much more economically than ITO-60 sputter coated film.

An important cause of failure of electroluminescent devices is an increase in operating temperature due to heating of the electroluminescent device as a result of electrical current transmission through the device. This is equal to $i^2R$ and hence proportional to the resistance of the lamp. The increase in resistance during operation is therefore an indication of the operating temperature of the electroluminescent devices and hence the potential lifetime of such devices in the absence of other failure mechanisms. The increase in resistance during operation was much lower for lamps with two PEDOT-electrodes (see INVENTION EXAMPLES 1 and 2) than with lamps with a PEDOT-electrode and a carbon electrode (see COMPARATIVE EXAMPLES 3 and 4) indicating a potentially longer lifetime for lamps with two PEDOT-electrodes.

INVENTION EXAMPLES 3 TO 8 AND COMPARATIVE EXAMPLES 7 TO 12

Preparation of PEDOT Paste 02

PEDOT paste 02, a transparent PEDOT paste, was produced at 25° C. by carefully adding to 100 g of a 1.2% by weight dispersion of PEDOT/PSS in water at 800 rpm in a dissolver, 1 g of CARBOPOL® ETD-2623, 15 g of diethylene-glycol, 10 g of n-propanol and finally after 1 hour of stirring the speed was increased to 1200 rpm and sufficient of a 25% solution of ammonia in water (ca. 0.5 ml) added to adjust the pH to a value of 5 followed by stirring for a further 5 minutes.

The PEDOT paste 02 had a viscosity of 13 Pa.s at 25° C. and a shear rate of 10 s$^-$. Screen printing with a P79 mesh followed by drying at 110° C. for 5 minutes produced a layer with a surface resistance of 800 Ω/square and an optical density of 0.06.

Preparation of PEDOT Paste 03

PEDOT paste 03, an opaque PEDOT paste, was produced at 25° C. by carefully adding to 100 g of a 1.2% by weight dispersion of PEDOT/PSS in water at 800 rpm in a dissolver, 1 g of CARBOPOL® ETD-2623, 15g of diethyleneglycol, 10 g of n-propanol, 3.6 g of LEVANYL™ A-SF, a black pigment from BAYER, and finally after 1 hour of stirring the speed was increased to 1200 rpm and sufficient of a 25% solution of ammonia in water (ca. 0.5 ml) added to adjust the pH to a value of 5 followed by stirring for a further 5 minutes.

The PEDOT paste 03 had a viscosity of 13 Pa.s at 25° C. and a shear rate of 10 s$^{-1}$. Screen printing with a P79 mesh followed by drying at 130° C. for 2 minutes produced a layer with a surface resistance of 700 Ω/square and an optical density of 0.50.

Preparation of Electroluminescent Devices

COMPARATIVE EXAMPLES 7 to 12 were prepared by screen printing the following layer configuration through a P79 mesh screen onto support nrs 3 to 8 (see above):

a layer of the DuPont LUXPRINT® type 7145L rear electrode, silver conductor (resistance of 1 ohm/square), was first applied forming a busbar for the first electrode;

a layer of paste 02 to a thickness after drying of 200 to 300 nm was then applied thereby forming the first (transparent) electrode;

followed by a layer of LUXPRINT™ 7151J, a zinc sulphide phosphor dispersion from Dupont, to a thickness after drying of 20 μm;

then applying 3 layers of the DuPont LUXPRINT® type 7153E, high K dielectric insulator ink (barium titanate), with drying between each application each having a thickness after drying of ca. 7 μm;

then applying a layer of DuPont LUXPRINT® type 7144E ink, a carbon conductor ink (resistance of 80 ohm/square), to a thickness after drying of ca. 8 μm as a back electrode; and finally a layer of the DuPont LUXPRINT® type 7145L rear electrode, silver conductor (resistance of 1 ohm/square), over sufficient of the surface of the back conductive layer to form a bus bar for the rear electrode.

The layer configuration of INVENTION EXAMPLES 3 to 8 differed from that of COMPARATIVE EXAMPLES 7 to 12 only in the replacement of the layer of DuPont LUX-PRINT® type 7144E ink by a layer of PEDOT paste 03 (surface resistance of 700 Ω/square) with a dry thickness of ca. 8 μm, which was dried at 120° C. for 2 minutes forming the second PEDOT-containing electrode according to the present invention.

Evaluation of the Electroluminescent Devices

The results of a performance evaluation of the electroluminescent devices of INVENTION EXAMPLES 3 to 8 and COMPARATIVE EXAMPLES 7 to 12 in simulated endurance tests as described for INVENTION EXAMPLES 1 and 2 and COMPARATIVE EXAMPLES 7 to 12 are given in Table 6.

From Table 6, it can be seen that for lamps coated on the same support, the emission and half-life of the lamps of INVENTION EXAMPLES 3 to 8 in which both the first and second electrodes were produced using PEDOT pastes exhibited superior emission half-lives and percentages of initial emission after 5 days in simulated lifetime tests compared with the lamps of COMPARATIVE EXAMPLES 7 to 12 in which the first electrode was produced using PEDOT paste 02 and the second (back) electrode was a carbon electrode produced with DuPont LUXPRINT® type 7144E ink. Furthermore, a reduction in emission faults was also observed with the lamps of INVENTION EXAMPLES 3 to 8 compared with the emission of the lamps of COMPARATIVE EXAMPLES 7 to 12.

This improvement in emission half-life and percentage emission after 5 days in simulated lifetime tests was associated with a lower increase in lamp resistance over 120 hours of emission for all the supports used.

Electroluminescent devices with two PEDOT-electrodes exhibited significantly lower increases in lamp resistance compared with lamps with a single PEDOT-electrode when coated on the same support, which indicated lower operating temperatures and hence potentially longer lamp lifetimes in the absence of other failure mechanisms.

TABLE 6

|  | support nr. | Initial emission [cd/m$^2$] | Initial resistance [Ω] | Emission half-life [hours] | Faults after 24 h? | Faults after 192 h? | after 120 h % age of initial emission | after 120 h % age of initial resistance |
|---|---|---|---|---|---|---|---|---|
| Comparative Example nr |  |  |  |  |  |  |  |  |
| 7 | 03 | 34 | 914 | 67 | none | ca. 20% of emitting area inactive | 12 | 198.1 |
| 8 | 04 | 33 | 840 | 36 | none | ca. 10% of emitting area inactive | 6 | 1561.9 |
| 9 | 05 | 32 | 776 | 28 | none | point faults | 6 | 759.0 |
| 10 | 06 | 32 | 867 | 15 | ca. 50% emitting area inactive | — | 0 | — |
| 11 | 07 | 30 | 802 | 33 | none | point faults | 3 | 664.6 |
| 12 | 08 | 29 | 896 | 74 | point faults | — | 0 | — |
| Invention Example nr |  |  |  |  |  |  |  |  |
| 3 | 03 | 29 | 774 | 70 | none | none | 21 | 151.2 |
| 4 | 04 | 30 | 781 | 72 | none | none | 20 | 212.3 |
| 5 | 05 | 29 | 736 | 60 | none | none | 17 | 198.6 |
| 6 | 06 | 28 | 844 | 70 | inactive lines | ca. 10% of emitting area inactive | 18 | 442.8 |
| 7 | 07 | 29 | 715 | 66 | none | point faults | 17 | 175.8 |
| 8 | 08 | 28 | — | 72 | point faults | point faults | 11 | — |

This effect was particularly marked in the case of the electroluminescent devices of COMPARATIVE EXAMPLE 8 with a single PEDOT-electrode and INVENTION EXAMPLE 4 with two PEDOT-electrodes both coated on support nr. 04, in which in the case of the lamp of COMPARATIVE EXAMPLE 8 the lamp resistance had increased to 1562% of its initial value after emitting for 120 hours at 60° C. in a relative humidity of 90% compared with 212% in the case of the lamp of INVENTION EXAMPLE 4.

This shows the surprising benefit of using PEDOT-containing a first transparent or translucent electrode together with a second electrode PEDOT-containing electrode, according to the present invention.

INVENTION EXAMPLES 9 TO 14

INVENTION EXAMPLES 9 to 14 were prepared by screen printing the following layer configuration through a P79 mesh screen onto support nrs 3 to 8 (see above):

a layer of the DuPont LUXPRINT® type 7145L rear electrode, silver conductor (resistance of 1 ohm/square), was first applied forming a busbar for the "second" electrode;

a layer of PEDOT paste 03 was then applied to the silver-coated support nrs. 3 to 8 to a thickness after drying at 130° C. for 2 minutes of 200 to 500 nm thereby forming the "second PEDOT-containing electrode" according to the present invention; then 3 layers of the DuPont LUXPRINT® type 7153E, high K dielectric insulator ink (barium titanate), were applied with drying between each application each having a thickness after drying of ca. 7 μm;

then a layer of LUXPRINT® 7151J, a zinc sulphide phosphor dispersion from Dupont, was applied to a thickness after drying of ca. 10 μm;

a layer of PEDOT paste 02 (surface resistance of 800 Ω/square) was applied which upon drying at 90° C. had a thickness of ca. 8 μm forming the first PEDOT-containing electrode" according to the present invention and finally a layer of the DuPont LUXPRINT® type 7145L rear electrode, silver conductor (resistance of 1 ohm/square), to sufficient of the second electrode surface to form a bus bar therefor.

Evaluation of the Electroluminescent Devices

The performance of the electroluminescent devices of INVENTION EXAMPLES 9 to 14 were evaluated in simulated endurance tests as described for INVENTION EXAMPLES 1 and 2 and COMPARATIVE EXAMPLES 7 to 12. The results are given in Table 7.

From Table 7, it can be seen that emission half-lives up to 51 hours can be obtained with the so-called reverse lamp configuration depending upon the support used, in which emission is observed through the uppermost layer rather than through the support as in the conventional electroluminescence lamp configuration, with a PEDOT-containing first transparent or translucent electrode together with a second electrode PEDOT-containing electrode, according to the present invention.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

We claim:

1. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or different, in which said two alkoxy groups may be the same or different or together represent an optionally substituted oxy-alkylene-oxy bridge, the process comprising the steps of: (i) coating a transparent or translucent support with a solution, a dispersion or a paste of a polymer or copolymer of a 3,4-dialkoxythiophene to produce said transparent or translucent first conductive layer; (ii) coating said first conductive layer with a layer comprising an electroluminescent phosphor; (iii) coating said layer comprising an electroluminescent phosphor with a dielectric layer; and (iv) coating said dielectric layer with a solution, dispersion or paste comprising a polymer or copolymer of a 3,4-dialkoxythiophene to produce said second conductive layer, wherein said polymer or copolymer of said 3,4-dialkoxythiophene in the solution, dispersion or paste used in step (i) may be the same or different from said polymer or copolymer of said 3,4-dialkoxythiophene used in the solution, dispersion or paste used in step (iv).

2. The process according to claim 1, wherein said paste is an aqueous paste.

3. The process according to claim 1, wherein said solution or dispersion is an aqueous solution or dispersion.

4. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or

TABLE 7

| Invention Example nr | support nr. | Initial emission [cd/m$^2$] | Initial resistance [Ω] | Emission half-life [hours] | Faults after 24 h? | faults after 168 h? | after 120 h % age of initial emission | % age of initial resistance |
|---|---|---|---|---|---|---|---|---|
| 9 | 03 | 39 | — | 51 | none | inhomogeneous emitting area | 10 | — |
| 10 | 04 | 37 | — | 39 | none | inhomogeneous emitting area | 5 | — |
| 11 | 05 | 39 | — | 32 | point faults | none | 5 | — |
| 12 | 06 | 38 | — | 34 | point faults | none | 5 | — |
| 13 | 07 | 40 | — | 28 | point faults | none | 2.5 | — |
| 14 | 08 | 42 | — | 26 | none | point faults | 5 | — | different, in which said two alkoxy groups may be the same or different or together represent an optionally substituted oxy-alkylene-oxy bridge, the process comprising the steps of: (i) coating a support with a solution, dispersion or paste comprising a polymer or copolymer of a (3,4-dialkoxythiophene) to produce said second conductive layer; (ii) coating said second conductive layer with a dielectric layer; (iii) coating said dielectric layer with a layer comprising an electroluminescent phosphor; and (iv) coating said layer comprising said electroluminescent phosphor with a transparent solution, dispersion or paste comprising a polymer or copolymer of a (3,4-dialkoxythiophene) to produce said transparent or translucent first conductive layer, wherein said polymer or copolymer of a (3,4-dialkoxythiophene) in said solution, dispersion or paste used in step (i) may be the same or different from said polymer or copolymer of a (3,4-dialkoxythiophene) used in said transparent solution, dispersion or paste used in step (iv).

5. The process according to claim 4, wherein said paste is an aqueous paste.

6. The process according to claim 4, wherein said transparent paste is an aqueous transparent paste.

7. A process comprising the steps of: using a transparent paste comprising a polymer or copolymer of a 3,4-dialkoxythiophene, a polyacrylate thickener and a glycol derivative, and optionally a surfactant for producing an electrode of an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or different, in which said two alkoxy groups may be the same or different or together represent an optionally substituted oxy-alkylene-oxy bridge.

8. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or different, in which said two alkoxy groups together represent an optionally substituted C1-C4 alkylene group or a cycloalkylene group, the process comprising the steps of: (i) coating a transparent or translucent support with a solution, a dispersion or a paste of a polymer or copolymer of a 3,4-dialkoxythiophene to produce said transparent or translucent first conductive layer; (ii) coating said first conductive layer with a layer comprising an electroluminescent phosphor; (iii) optionally coating said layer comprising an electroluminescent phosphor with a dielectric layer; and (iv) optionally coating said dielectric layer if present, or said layer comprising the electroluminescent phosphor if no dielectric layer is present, with a solution, dispersion or paste comprising a polymer or copolymer of a 3,4-dialkoxythiophene to produce said second conductive layer, wherein said polymer or copolymer of said 3,4-dialkoxythiophene in the solution, dispersion or paste used in step (i) may be the same or different from said polymer or copolymer of said 3,4-dialkoxythiophene used in the solution, dispersion or paste used in step (iv), wherein said paste is an aqueous paste.

9. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxy-thiophene, which may be the same or different, in which said two alkoxy groups together represent an optionally substituted C1-C4 alkylene group or a cycloalkylene group, the process comprising the steps of: (i) coating a support with a solution, dispersion or paste comprising a polymer or copolymer of a (3,4-dialkoxythiophene) to produce said second conductive layer; (ii) optionally coating said second conductive layer with a dielectric layer; (iii) coating said dielectric layer if present, or said second conductive layer if no dielectric layer is present, with a layer comprising an electroluminescent phosphor; and (iv) coating said layer comprising said electroluminescent phosphor with a transparent solution, dispersion or paste comprising a polymer or copolymer of a (3,4-dialkoxythiophene) to produce said transparent or translucent first conductive layer, wherein said polymer or copolymer of a (3,4-dialkoxythiophene) in said solution, dispersion or paste used in step (i) may be the same or different from said polymer or copolymer of a (3,4-dialkoxythiophene) used in said transparent solution, dispersion or paste used in step (iv), wherein said paste is an aqueous paste.

10. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxy-thiophene, which may be the same or different, in which said two alkoxy groups together represent an optionally substituted C1-C4 alkylene group or a cycloalkylene group, the process comprising the steps of: (i) coating a support with a solution, dispersion or paste comprising a polymer or copolymer of a (3,4-dialkoxythiophene) to produce said second conductive layer; (ii) optionally coating said second conductive layer with a dielectric layer; (iii) coating said dielectric layer if present, or said second conductive layer if no dielectric layer is present, with a layer comprising an electroluminescent phosphor; and (iv) coating said layer comprising said electroluminescent phosphor with a transparent solution, dispersion or paste comprising a polymer or copolymer of a (3,4-dialkoxythiophene) to produce said transparent or translucent first conductive layer, wherein said polymer or copolymer of a (3,4-dialkoxythiophene) in said solution, dispersion or paste used in step (i) may be the same or different from said polymer or copolymer of a (3,4-dialkoxythiophene) used in said transparent solution, dispersion or paste used in step (iv), wherein said paste is an aqueous paste.

11. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or different, in which said two alkoxy groups may be the same or different or together represent an optionally substituted oxy-alkylene-oxy bridge, the process comprising the steps of: (i) coating a transparent or translucent support with a solution, a dispersion or a paste of a polymer or copolymer of a 3,4-dialkoxythiophene to produce said transparent or translucent first conductive layer; (ii) coating said first conductive layer with a layer comprising an electroluminescent phosphor; (iii) optionally coating said layer comprising an electroluminescent phosphor with a dielectric layer; and (iv) coating said dielectric layer if present, or said layer comprising the electroluminescent phosphor if no dielectric layer is present, with a solution, dispersion or paste comprising a polymer or copolymer of a 3,4-dialkoxythiophene to produce said conductive layer, wherein said polymer or copolymer of said 3,4-dialkoxythiophene in the solution, dispersion or paste used in step (i) may be the same or different from said polymer or copolymer of said 3,4-dialkoxythiophene used in the solution, dispersion or paste used in step (iv) and wherein said electroluminescent phosphor belongs to the class of II-VI semiconductors or is a combination of a group II element with an oxidic anion.

12. The process according to claim 11, wherein said paste is an aqueous paste.

13. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a (3,4-dialkoxythiophene), which may be the same or different, in which said two alkoxy groups may be the same or different or together represent an optionally substituted oxy-alkylene-oxy bridge, the process comprising the steps of: (i) coating a support with a solution, dispersion or paste comprising a polymer or copolymer of a (3,4-dialkoxythiophene) to produce said second conductive layer; (ii) optionally coating said second conductive layer with a dielectric layer; (iii) coating said dielectric layer if present, or said second conductive layer if no dielectric layer is present, with a layer comprising an electroluminescent phosphor; and (iv) coating said layer comprising said electroluminescent phosphor with a transparent solution, dispersion or paste comprising a polymer or copolymer of a (3,4-dialkoxythiophene) to produce said transparent or translucent first conductive layer, wherein said polymer or copolymer of a (3,4-dialkoxythiophene) in said solution, dispersion or paste used in step (i) may be the same or different from said polymer or copolymer of a (3,4-dialkoxythiophene) used in said transparent solution, dispersion or paste used in step (iv) and wherein said electroluminescent phosphor belongs to the class of II-VI semiconductors or is a combination of a group II element with an oxidic anion.

14. The process according to claim 13, wherein said transparent solution or dispersion is an aqueous solution or dispersion.

15. The process according to claim 13, wherein said paste is an aqueous paste.

16. The process according to claim 13, wherein said transparent paste is an aqueous paste transparent paste.

17. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or different, in which said two alkoxy groups may be the same or different or together represent an optionally substituted oxy-alkylene-oxy bridge, the process comprising the steps of: (i) coating a transparent or translucent support with a solution, a dispersion or a paste of a polymer or copolymer of a 3,4-dialkoxythiophene to produce said transparent or translucent first conductive layer; (ii) coating said first conductive layer with a layer comprising an electroluminescent phosphor; (iii) optionally coating said layer comprising an electroluminescent phosphor with a dielectric layer; and (iv) coating said dielectric layer if present, or said layer comprising the electroluminescent phosphor if no dielectric layer is present, with a solution, dispersion or paste comprising a polymer or copolymer of a 3,4-dialkoxythiophene to produce said conductive layer, wherein said polymer or copolymer of said 3,4-dialkoxythiophene in the solution, dispersion or paste used in step (i) may be the same or different from said polymer or copolymer of said 3,4-dialkoxythiophene used in the solution, dispersion or paste used in step (iv) and wherein at least one of said two electrodes further comprises a polyanion compound.

18. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or different, in which said two alkoxy groups may be the same or different or together represent an optionally substituted oxy-alkylene-oxy bridge, the process comprising the steps of: (i) coating a support with a solution, dispersion or paste comprising a polymer or copolymer of a (3,4-dialkoxythiophene) to produce said second conductive layer; (ii) optionally coating said second conductive layer with a dielectric layer; (iii) coating said dielectric layer if present, or said second conductive layer if no dielectric layer is present, with a layer comprising an electroluminescent phosphor; and (iv) coating said layer comprising said electroluminescent phosphor with a transparent solution, dispersion or paste comprising a polymer or copolymer of a (3,4-dialkoxythiophene) to produce said transparent or translucent first conductive layer, wherein said polymer or copolymer of a (3,4-dialkoxythiophene) in said solution, dispersion or paste used in step (i) may be the same or different from said polymer or copolymer of a (3,4-dialkoxythiophene) used in said transparent solution, dispersion or paste used in step (iv) and wherein at least one of said two electrodes further comprises a polyanion compound.

19. The process according to claim 17, wherein said paste is an aqueous paste.

20. The process according to claim 17, wherein said transparent solution or dispersion is an aqueous solution or dispersion.

21. The process according to claim 18, wherein said paste is an aqueous paste.

22. The process according to claim 18, wherein said paste transparent paste is an aqueous transparent paste.

23. A process comprising the steps of: providing an electroluminescent device comprising a transparent or translucent support, a transparent or translucent first electrode, a second conductive electrode and an electroluminescent phosphor layer sandwiched between said transparent or translucent first electrode and said second conductive electrode; and preparing an illuminated poster or signage which comprises said electroluminescent device, wherein said first and second electrodes each comprises a polymer or copolymer of a 3,4-dialkoxythiophene, which may be the same or different, in which said two alkoxy groups together represent an optionally substituted oxy-alkylene-oxy bridge.

24. A process for producing an electroluminescent device which comprises a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or different, in which said two alkoxy groups are represented by —OR1 and —OR2 where each of R1 and R2 independently represents a C1-C4 alkyl group, the process comprising the steps of: (i) coating a transparent or translucent support with a solution, a dispersion or a paste of a polymer or copolymer of a 3,4-dialkoxythiophene to produce said transparent or translucent first conductive layer; (ii) coating said first conductive layer with a layer comprising an electroluminescent phosphor; (iii) optionally coating said layer comprising an electroluminescent phosphor with a dielectric layer; and (iv) optionally coating said dielectric layer if present, or said layer comprising the electroluminescent phosphor if no dielectric layer is present, with a solution, dispersion or paste comprising a polymer or copolymer of a 3,4-dialkoxythiophene to produce said second conductive layer, wherein said polymer or copolymer of said 3,4-dialkoxythiophene in the solution, dispersion or paste used in step (i) may be the same or different from said polymer or copolymer of said 3,4-dialkoxythiophene used in the solution, dispersion or paste used in step (iv), wherein said paste is an aqueous paste.

25. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or different, in which said two alkoxy groups are represented by —OR1 and —OR2 where each of R1 and R2 independently represents a C1-C4 alkyl group, the process comprising the steps of: (i) coating a support with a solution, dispersion or paste comprising a polymer or copolymer of a (3,4-dialkoxythiophene) to produce said second conductive layer; (ii) optionally coating said second conductive layer with a dielectric layer; (iii) coating said dielectric layer if present, or said second conductive layer if no dielectric layer is present, with a layer comprising an electroluminescent phosphor; and (iv) coating said layer comprising said electroluminescent phosphor with a transparent solution, dispersion or paste comprising a polymer or copolymer of a (3,4-dialkoxythiophene) to produce said transparent or translucent first conductive layer, wherein said polymer or copolymer of a (3,4-dialkoxythiophene) in said solution, dispersion or paste used in step (i) may be the same or different from said polymer or copolymer of a (3,4-dialkoxythiophene) used in said transparent solution, dispersion or paste used in step (iv), wherein said paste is an aqueous paste.

26. A process for producing an electroluminescent device comprising a transparent or translucent support, a transparent or translucent first electrode, a second conductive electrode and an electroluminescent phosphor layer sandwiched between said transparent or translucent first electrode and said second conductive electrode, wherein said first and second electrodes each comprises a polymer or copolymer of a 3,4-dialkoxythiophene, which may be the same or different, in which said two alkoxy groups are represented by —OR1 and —OR2 where each of R1 and R2 independently represents a C1-C4 alkyl group, the process comprising the steps of: (i) coating a support with a solution, dispersion or paste comprising a polymer or copolymer of a (3,4-dialkoxythiophene) to produce said second conductive layer; (ii) optionally coating said second conductive layer with a dielectric layer; (iii) coating said dielectric layer if present, or said second conductive layer if no dielectric layer is present, with a layer comprising an electroluminescent phosphor; and (iv) coating said layer comprising said electroluminescent phosphor with a transparent solution, dispersion or paste comprising a polymer or copolymer of a (3,4-dialkoxythiophene) to produce said transparent or translucent first conductive layer, wherein said polymer or copolymer of a (3,4-dialkoxythiophene) in said solution, dispersion or paste used in step (i) may be the same or different from said polymer or copolymer of a (3,4-dialkoxythiophene) used in said transparent solution, dispersion or paste used in step (iv), wherein said transparent paste is an aqueous transparent paste.

* * * * *